United States Patent [19]

Liebler et al.

[11] Patent Number: 4,663,199
[45] Date of Patent: May 5, 1987

[54] WET METALLIZATION OF ACRYLIC RESIN ARTICLES

[75] Inventors: Ralf Liebler, Darmstadt; Manfred Munzer, Bensheim; Peter Quis, Darmstadt, all of Fed. Rep. of Germany; Petrus E. J. Legierse, Nuenen, Netherlands

[73] Assignee: Röhm GmbH, Darmstadt, Fed. Rep. of Germany

[21] Appl. No.: 838,186

[22] Filed: Mar. 7, 1986

Related U.S. Application Data

[63] Continuation of Ser. No. 672,808, Nov. 19, 1984, abandoned.

[30] Foreign Application Priority Data

Nov. 17, 1983 [DE] Fed. Rep. of Germany ....... 3341536
Sep. 29, 1984 [DE] Fed. Rep. of Germany ....... 3435898

[51] Int. Cl.$^4$ .............................................. C23C 18/20
[52] U.S. Cl. .................................. 427/304; 427/162; 427/305; 427/306
[58] Field of Search ......................... 427/162, 304–306

[56] References Cited

U.S. PATENT DOCUMENTS

| | | | |
|---|---|---|---|
| 3,094,430 | 6/1963 | Skwierinski . | |
| 3,524,754 | 8/1970 | Blytas et al. | 117/47 |
| 3,779,790 | 12/1973 | Miller | 117/47 A |
| 3,998,602 | 12/1976 | Horowitz et al. | 29/195 |
| 4,244,789 | 1/1981 | Coll-Palagos | 427/306 |
| 4,246,320 | 1/1981 | Coll Palagos | 427/306 |
| 4,363,844 | 12/1982 | Lewis | 428/163 |
| 4,420,506 | 12/1983 | Nelissen | 427/162 |

FOREIGN PATENT DOCUMENTS

| | | |
|---|---|---|
| 733892 | 5/1969 | Belgium . |
| 70595 | 1/1983 | European Pat. Off. . |
| 1569434 | 6/1969 | Fed. Rep. of Germany . |
| 49-48171 | 10/1974 | Japan . |
| 85300 | 6/1976 | Poland . |
| 1343212 | 1/1974 | United Kingdom . |

OTHER PUBLICATIONS

*Water Soluble Resins*, Edited by Davidson et al., Reinhold Publishing Corporation, New York, ©1962, pp. 133–143.
Chem. Abstracts 90, 112118j.

*Primary Examiner*—John D. Smith
*Attorney, Agent, or Firm*—Curtis, Morris & Safford

[57] ABSTRACT

A method for wet metallizing articles made, or having a surface to be metallized, of an acrylic polymer containing at least 0.01 percent of acrylamide, methacrylamide, or of an acrylate ester or amide of an alkanol or alkyl amine have a terminal basic nitrogen group, e.g., an amino, substituted amino, or basic nitrogen heterocyclic group.

6 Claims, No Drawings

WET METALLIZATION OF ACRYLIC RESIN ARTICLES

This application is a continuation of application Ser. No. 672,808 filed Nov. 19, 1984, now abandoned.

The present invention relates to a method for the wet metallization of surfaces of certain synthetic resins and to metallized articles produced by this method. The metallized articles so obtained are extremely well suited for use as mirrors of all kinds and as information storage media and the like.

The wet metallization of surfaces, and particularly the wet metallization of synthetic resin surfaces, is of considerable practical importance. Wet metallization usually involves a number of process steps, namely:

(1) Activation of the surface ("seeding"),
(2) deposition of the metal layer by reduction from metal-salt baths, and optionally
(3) electrolytic intensification.

While the metallization of two-phase synthetic resins such as ABS or partly crystalline and filler-loaded plastics which have undergone a chemical pretreatment ("pickling") on the whole poses no problems, experience has shown that in the case of single-phase polymers considerable problems are encountered, especially with regard to adherence.

Many attempts have been made to achieve optically flawless, firmly adhering, and durable metallization with sufficiently good mechanical properties through appropriate pretreatment of the resins. A strictly mechanical pretreatment, roughening with sand, is disclosed in U.S. Pat. No. 3,915,809.

A substantial part of the investigations has been devoted to the chemical pretreatment of the surfaces. A pretreatment with tannic acid (=tannin) is known from U.S. Pat. No. 3,094,430. Oxidative pretreatment with $H_2O_2$ or peroxide in sulfuric acid is recommended in published German patent application DOS No. 15 69 434. A pretreatment with aqueous solutions of chlorides of metal ions having two valence states is described in Japanese patent publication No. 1725/70.

According to U.S. Pat. No. 3,524,754, polymeric substrates are pretreated by impregnating the surface to a depth of 5 microns with a solution of a copper salt in a solvent which causes the polymer partly to dissolve or to swell.

U.S. Pat. No. 3,779,790 provides for a two-phase treatment first using white phosphorus in a chlorinated hydrocarbon or benzene and then a metal salt solution.

Another kind of pretreatment involves the application of a lacquer coating prior to metallization. According to British Pat. No. 1,379,191, nitrocellulose is used for this purpose. According to Polish Pat. No. 85,300 (cf. Chem. Abstr. 90, 112118j), ultrafine copper powder in a polymethyl methacrylate/chloroform solution is distributed over the surface and the solvent is evaporated.

Other publications see a solution in a modification of the substrate, for example by incorporating tin chloride, palladium chloride, or inorganic lead compounds in the polymer according to Japanese patent publication No. 74 481-71.

In published European patent application No. 0 070 595, a process for the production of an at least partly metallized article is claimed wherein a monomer mixture of acrylates is polymerized together with N-substituted pyrrolidone compounds and the polymeric article so produced is treated with an aromatic carboxylic acid which is substituted in the nucleus with one or more hydroxyl and/or amino groups (for example, tannic acid), or derivatives thereof, followed by the actual wet metallization. In that European patent application, it is emphasized that the good adhesion which has been observed is due to the formation of a stable and strong complex between the pyrrolidone compound and the carboxylic acid or its derivatives.

The prior art processes described have failed to provide for a firmly adhering, durable metallization, especially of single-phase resins, that is optically and mechanically fully satisfactory in all cases. While the adhesion of a layer of metal is improved after chemical pretreatment of modification of the substrate, this improvement does not fully meet existing requirements, particularly with respect to the effect of moisture. In addition, the substrates will in some cases swell, with attendant impairment of the optical quality. Mechanical roughening and lacquering of a substrate to improve adhesion usually also have a very detrimental effect on the optical quality.

It has been found according to the present invention that metallized articles of high quality can be obtained by the wet metallization of substrates which are formed entirely, or at least in the surface regions to be metallized, of a polymer incorporating at least 0.01 weight percent and up to 30 weight percent, based on the polymer, of compounds of acrylic acid and/or methacrylic acid which contain amino groups. The synthetic resins of the invention lend themselves particularly well to use as substrates for metallization by the method of published European patent application 0 070 595. This method provides for a treatment of the surface to be metallized with aromatic acids which are substituted in the aromatic ring with one or more hydroxyl groups and/or amino groups, or compounds thereof capable of releasing such acids, optionally followed by a treatment with a sensitizer, for example a solution of a metal salt such as $SnCl_2$, and, finally, wet metallization without the use of electrolytic deposition.

Said polymer is preferably an acrylic resin having a glass transition, $T_g$, above 70° C. In contradistinction to European patent application No. 0 070 595, the polymeric substrate in accordance with the present invention contains no N-substituted pyrrolidone as a comonomer. Nor does it contain comonomers carrying hydroxyl groups. The polymer generally comprises from 50 to 99.99 weight percent of at least one ester of acrylic acid and/or of methacrylic acid with $C_1$–$C_{20}$ alcohols, said alcohols being linear, branched, or cyclic, alkanols.

The polymer preferably contains at least 50 and up to 99.99 weight percent of methyl methacrylate. The latter may be replaced by suitable other acrylate or methacrylate monomers, for example ethyl methacrylate. Thus, the polymer may contain from 0 to 49.99 weight percent of other monomers copolymerizable with methyl methacrylate, for example esters of acrylic acid with $C_1$–$C_{20}$ alcohols and/or esters of methacrylic acid with $C_2$–$C_{20}$ alcohols, and especially methyl acrylate, ethyl methacrylate, propyl and isopropyl acrylate and methacrylate, n-butyl and isobutyl acrylate and methacrylate, ethylhexyl acrylate and methacrylate, and hexyl acrylate and methacrylate. Moreover, esters of acrylic or methacrylic acid with cylic alcohols such as cyclohexyl or isobornyl-3,3,5-trimethylcyclohexyl alcohol and the like may be copolymerized.

The derivatives of acrylic and/or methacrylic acid which contain amino groups can essentially be represented by the formula

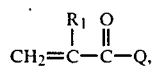

wherein $R_1$ is hydrogen or methyl and Q is amino or —Y—Z, where Y is oxygen or —$NR_2$— and $R_2$ is hydrogen or alkyl having 1 to 6 carbon atoms, and Z is

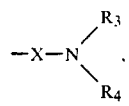

wherein $R_3$ and $R_4$, taken alone, are, independently of each other, hydrogen or linear or branched alkyl having 1 to 6 carbon atoms, or wherein $R_3$ and $R_4$, taken together with the nitrogen atom to which they are bound, and optionally together with further nitrogen or oxygen atoms, form a five- or six- membered heterocyclic ring and X is alkylene having from 2 to 6 carbon atoms.

Preferably, Q is —$NH_2$ and $R_1$ is hydrogen. Examples are 2-dimethylamino-and 2-diethylaminoethylacrylate and methacrylate, 2-dimethylaminopropyl and 2-diethylaminopropyl-acrylate and methacrylate, 2-tert-butylaminoethyl-acrylate and -methacrylate, as well as the 3-dialkylamino-2, 2-dimethylpropyl-1-acrylates and -methacrylates, and particularly the 3-dimethylamino- and 3-diethylamino-compounds, and the amides (Y=—$NR_2$—) corresponding to said compounds wherein $R_2$ is hydrogen, methyl, or ethyl. Morpholinoethyl acrylate and methacrylate as well as the corresponding amides are also of interest.

The acrylic acid or methacrylic acid compound containing an amino group is present in the polymer in an amount of at least 0.01 percent by weight and can be up to 30 percent by weight of the polymer. Preferably the amount is from 1 to 15 percent and especially 7±5 percent by weight. A polymer comprising at least 0.01 percent, preferably at least .1 percent, and up to 30 percent by weight of acrylamide is especially preferred. As an additional comonomer, methacrylamide should be mentioned, preferably in amounts less than 15 percent by weight of the polymer. That embodiment in which acrylamide is a comonomer is superior to other embodiments, particularly from the point of view of the adherence of the applied metal coating.

As a rule, the monomers should be selected so that the dynamic glass transition temperature, $T_{\lambda max}$, (in conformity with DIN 7724 and DIN 53445) (see Vieweg-Esser, Kunststoff-Handbuch, 1975, vol. IX, pp. 333-340) of the resulting polymer is not below 80° C., and preferably not below 90° C. The weight average molecular weight of the polymer, as determined by gel permeation chromatography, generally will range from 50,000 to 400,000, and preferably from 100,000 to 200,000. The polymer may further contain crosslinking monomers in amounts ranging from 0 to 10, and preferably from 0.1 to 8, weight percent. Suitable crosslinking monomers are those usually employed for this purpose which have at least two polymerizable units and more particularly two vinylic double bonds, per molecule, for example acrylic acid or methacrylic acid esters of diols or polyols, such as glycol diacrylate or dimethacrylate and butanediol diacrylate or dimethacrylate; trivalent crosslinking agents such as trimethylopropane triacrylate or trimethacrylate; unsaturated di- and poly-amides of di- and poly-amines such as methylenebis-acrylamide or -methacrylamide; and also monomers having several different polymerizable groups in the molecule such as vinyl methacrylate, allyl methacrylate, and triallyl cyanurate. (See H. Rauch-Puntigam and Th.Volker in *Acryl- and Methacrylverbindungen,* Springer Verlag, 1967.)

When the polymer is not composed entirely of the monomers named, it may contain further monomers of other types which are capable of free-radical polymerization (see *Ullmanns Enzklopadie der technischen Chemie,* 3rd ed., vol. 14, pp. 108-110, Urban & Schwarzenberg), for example styrene and its methyl-substituted derivatives such as alpha- and para-methylstyrene, acrylonitrile and/or methacrylonitrile, glycidyl acrylate or methacrylate, and chloroethyl acrylate, in amounts ranging from 0 to 49.99, and preferably from 0 to 30, weight percent, based on the polymer.

The free radical polymerization of the monomers may be carried out by prior art methods.

As a rule, polymerization will be initiated with initiators yielding free radicals, for example organic peroxides and peresters such as butyl peroctoate or tert-butyl peroxy-2-ethylhexanoate and tert-butyl-peroxy neodecanoate, or by means of azo compounds such as azoisobutyronitrile, etc. (See Rauch-Puntigam, loc. cit.)

The initiator will be used in the usual amount, that is from about 0.01 to 0.5 weight percent, based on the monomers.

For regulation of the molecular weight, polymerization modifiers such as the commonly employed organosulfur chain transfer agents, for example longer-chain alkyl mercaptans such as dodecyl mercaptan, thioglycolic esters such as 2-ethylhexyl thioglycolate, etc., are generally used. As is known, the molecular weight of polymers can be controlled by means of the initiator, and especially by means of the addition of a modifier. The latter will generally be used in an amount ranging from 0.05 to 2 weight percent, based on the monomers. As mentioned earlier, the molecular weight of the polymers suitable for use in accordance with the invention usually ranges from 50,000 to 400,000 and preferably from 100,000 to 200,000. Quite generally, the same polymerization methods can be used as those employed for methyl methacrylate and its copolymers with other monomers. (See also Houben-Weyl, *Methoden der organischen Chemie,* 4th Ed., vol. 14/1.) Bulk polymerization has proved particularly well suited for the purpose here involved. (See also Rauch-Puntigam and Th. Volker, loc. cit., pp. 203-207 and 274-275.)

Initial polymerization at 50° C. (as a guide value) (water bath) for about 24 hours, followed by final polymerization at about 110° C. for about 10±2 hours, has been found appropriate.

The polymer may also be produced or cured by means or ultraviolet radiation. In that case, it will be advisable to add one or more UV-sensitizers, for example ketones and ketals such as benzyldimethyl ketal. Such sensitizers should be used in amounts ranging from 1 to 5 weight percent, based on the monomers.

The articles to be metallized may be formed entirely of the aforementioned polymer; however the polymer may also be present in only part of the article, for example as a surface layer or a portion of the surface, but in any case in the places to be metallized. In the latter case, a layer of the polymer is applied conventionally and adherently to the base in the contemplated surface regions, for example by polymerization in situ (curing), by injection molding, lamination, coextrusion, etc. The thickness of the polymer layer will depend on the end use, as will be shown below.

The polymer can be processed, for example granulated, in the manner and by the methods used with thermoplastics (acrylic resins), the granules then being used conventionally in extrusion or in compression- or injection-molding. The polymer may also be bulk-polymerized to form sheets and compression molded, extruded or injection molded.

The embodiments suitable for use as optically readable information storage disks will now be described in detail. Particularly preferred is the production of so-called video long-play (VLP) and audio long-play (ALP) disks. Treatment of the polymers up to the metallizing step, and the metallizing step itself, may be carried out in much the same manner as described in published European patent application No. 0 070 595. A mechanical pretreatment such as roughening of the plastic substrate is not contemplated. Polymers such as acrylic resins, and particularly polymethyl methacrylate and copolymers thereof, polyolefins and especially polypropylene, polycarbonates, polyvinyl chloride, polyamides, polyesters, polyurethanes, polyimides, polysulfones, polyacetals, and polystyrenes, copolymers, and polymer blends and glass are suitable for use as a transparent material for optically readable information storage disks. These information storage disks have at least on one side thereof optically readable structural units in the form of elevations and depressions. These usually have very small dimensions, for example a difference in height of from 0.1 to 0.8 micron and a length of from 0.3 to 3 microns, depending on the information to be stored. The structural units to be optically read are then provided with a metal coating.

As is known, the readability of the information by means of a laser beam is based on that difference in height. Advantageously, the optically readable information storage disks are produced by contacting a matrix containing information in the form of raised and recessed structural units on the surface of one side with the liquid polymerization mixture, or, more particularly, with the monomers or prepolymers of the polymer, then polymerizing it or them, thus copying the optical structure. The copy so obtained can then form the substrate for further treatment (metallization, etc.).

In one advantageous embodiment, the matrix is covered with a layer of the liquid polymer mixture, a transparent base disk is placed on it, the layer is polymerized (or cured), and the base disk along with the adhering polymer layer containing a copy of the information is removed from the matrix.

Production of the polymer is followed by a treatment of the surfaces or surface portions to be metallized with aromatic acidic compounds which contain one or more hydroxyl groups and/or amino groups, or with compounds liberating such acid compounds, more particularly phenols and hydroxylated benzoic acids.

Preferably, di- or tri-hydroxybenzoic acids, or compounds thereof which under hydrolysis conditions liberate di- or tri-hydroxybenzoic acids, are used. These latter compounds include in particular esters, for example esters of polyols and especially of sugars.

Illustrative of these are pyrogallic carboxylic acid (2, 3, 4-trihydroxybenzoic acid) and gallic acid as well as the depsides and didepsides, for example the digallic acids, and especially the tannins, which generally represent a mixture of multiply galloylated glucoses. (See P. Karrer, *Lehrbuch der organischen Chemie*, 12th Ed., Georg Thieme Verlag, 1954, pp. 527-534, and D. Roux et al. in "Applied Polymer Symposium", No. 28 [1957], pp. 335-353, John Wiley & Sons.)

The hydroxylated benzoic acids are advantageously applied in aqueous form, the pH value of the solutions being advantageously below 7, generally in the range from 1.5 to 6, and preferably from 3 to 6. The pH value can be brought into the desired pH range by adding appropriate acids or bases, if necessary.

The concentration of the hydroxylated benzoic acids may vary over a relatively wide range. For example, it may range from 0.001, but preferably from 0.01, to 10 grams per liter. When tannins, for example, are used, a lower limit of 0.01 g/l should be observed in the aqueous solution, although usable results will be obtained even in the range from 0.001 to 0.01 g/l.

The solutions containing the hydroxylated benzoic acids may be applied by conventional techniques such as spread coating, knife coating, dip coating, or atomization. As a rule, a relatively short treating time ranging from several seconds to a few minutes will suffice.

Metallization is preferably preceded by a sensitizing step involving treatment with a solution of a salt of a reducing metal. This is based on the assumption that such pretreatment with a reducing metal will initiate and accelerate metal deposition on the surface. In the case of metallization with silver, for example, it is advisable that the resin surfaces which have been pretreated with hydroxylated benzoic acids be treated with an acidic $SnCl_2$ solution. This aqueous solution (0.05-0.5 g/l) can be applied by dipping or spraying. The treating time should range from a few seconds to one minute. Even very small amounts of $SnCl_2$ on the order of 0.05 g/l can be sufficient, but a concentration of about 0.1 g/l is preferred. The excess of metal salt is removed by spraying with water.

The actual wet metallization is then carried out with an aqueous solution of a salt of the metal to be used for metallization. An example is an ammoniacal silver nitrate solution in combination with an appropriate reducing agent. A suitable reducing agent is formaldehyde, for example, in combination with a sugar such as sodium gluconate. Illustrative of other suitable reductants are hydrazine compounds such as hydrazine sulfate and hydroxyethylhydrazine, reducing carbohydrates, ascorbic acid, glyoxal in combination with triethanolamine, tartrates, and the like. The pH value of the ammoniacal silver salt solution advantageously ranges from 9 to 12 and preferably is below 10.

Metallization may also be carried out by the aerosol plating technique. (See "The Technology of Aerosol Plating", by D. J. Levy, in Technical Proceedings, 51st Annual Convention, American Electroplaters Society, June 14-18, 1964, St. Louis, pp. 139-149.) In this technique, the metal salt solution and the reducing solution are simultaneously atomized onto the polymer surface to be metallized. Metallization may be followed by the deposition of a further metal coating, which may be done electrolytically, for example. Galvanic copper plating, for example, may be effected by using a silver surface coating as the cathode.

The polymer of the invention thus is particularly well suited for the production of articles which have a specially structured boundary region between the substrate material and the metal coating.

As mentioned at the outset, the process of the invention is also suited for the production of other high quality metallized objects, for example mirrors.

The makeup of the mirrors and the sequence of treating steps are basically the same as those described in connection with optically readable information storage disks. Carrier base sheets made of the resins mentioned earlier or of glass may be used, or the polymer of the invention may also serve as the base or carrier.

Surface coating with the polymer of the invention may be carried out by the techniques commonly employed with acrylic resins, for example polymerization in situ, spray coating, lamination, and coextrusion. (See Kirk-Othmer, 3rd Ed., vol. 6, pp. 386–426. With regard to compatibility in coextrusion, for example, see D. Djordjevic in "Neue Verpackung", 7/78, pp. 1041–1046.)

The treatment with phenol or aromatic carboxylic acid substituted with one or more hydroxyl groups may also be carried out as described in connection with optical information storage disks. Sensitization by treatment with a reducing metal salt solution, for example an acidic $SnCl_2$ solution, may also be performed as described above. For metallization, modern wet mirror coating techniques may be employed, for example. (See Ullmanns *Enzyklopadie der technischen Chemie*, 4th Ed., vol. 21, pp. 633–636, Verlag Chemie, Weinheim.) Known coating methods, such as the rocking technique or the more modern spray silver coating technique may also be used.

In the rocking technique, a trough in which the substrates are centrally held is set into a steady rocking motion through a cam drive, an ammoniacal silver salt solution (I), an alkaline solution (II) and a reducing solution (III) being used concurrently.

The following recipe will serve as a guide for the solutions:

Solution I: 400 g of silver nitrate, 3 liters of water, 1200 ml of ammonia (specific gravity, 0.91). Solution II: 500 g of sodium hydroxide, 3 liters of water. Solution III: Boil 3 liters of water with 300 g of sugar cubes, add 10 ml of $H_2SO_4$ and boil for another 5 minutes. After cooling, add 90 ml of 99% alcohol to give the reducing solution. The combined solutions I and II are made up with water to 90 liters. 12 ml of reducing solution III are added to 1 liter of the combined solutions. Deposition of the silver layer by the rocking technique takes about 5 minutes. With an amount of silver of about 4 to 5 g/m$^2$, about 1 g/m$^2$ is deposited on the plastic substrate.

The more modern spray silver coating method also lends itself to the metallization of resin substrates, for example by the use of mirror production lines in much the same manner as in the metallization of inorganic glass. Mirror production lines operate with conveyor belt widths on the order of meters. With a silver deposit of about 0.8 g/m$^2$, the machine will work with from 1.5 to 3 g/m$^2$ of silver. (See Ullmanns, loc. cit.) The technique usually involves the following steps:

Cleaning of the resin substrate, if indicated—pretreating by applying a reducing salt (tin salt) solution—rinsing—silver coating—rinsing—copper coating (optional)—rinsing—drying—lacquering (optional)—drying.

The following recipe will serve as a guide for silver spray coating:

Solution I: 200 g of silver nitrate and 350 ml of ammonia (specific gravity, 0.91) are made up with water to 1000 ml.

Solution II: 100 g of sodium hydroxide are dissolved in water and made up to 1 liter.

Solution III: 100 g of dextrose, 8 ml of concentrated sulfuric acid, and 20 ml 40% formaldehyde are made up with water to 1 liter.

The silver solution consists of 200 ml of solution I plus 200 ml of solution II, made up with water to 4.6 liters. The reducing solution consists of 200 ml of solution III plus 4.8 liters water. The solutions can be deposited through nozzles arranged in pairs by the use of compressed air.

Copper deposition can be carried out by the contact copper coating method, for example, in which a base metal such as iron or zinc dust is applied in aqueous solution, for example sprayed on by means of a two component nozzle together with an acidic copper-sulfate solution. The base metal causes cupric ions to be precipitated and deposited on the silver, which acts as a cathode.

A guide recipe for copper coating is:

Solution I: 50 g of zinc dust and, optionally, 100 g of a dispersant in 2 liters of water.

Solution II: 50 g of $CuSO_4.5H_2O$ and 40 g of $H_2SO_4$ (96%) in 20 liters of water.

Solutions I and II are simultaneously atomized onto a silver coated plastic substrate (disks). The atomizing pressure may be 5 atmospheres, for example, and the atomization time about 1 minute.

Finally, a lacquer or varnish coat, optionally a two-layer coat, may be applied on top of the metal coating. The coating material should be free of constituents which have a deleterious effect on silver. Oxidatively drying varnishes are usually used for the base coat and physically drying systems for the top coat or as one-layer coatings. (See Kempf, Industrie-Lackier-Betrieb 1957, No. 1, pp. 17–21.)

The disks to be metallized are preferably produced from the polymer of the invention by conventional methods such as injection molding or extrusion.

However, as mentioned earlier the surface particularly well suited for metallization, formed of the polymer of the invention, may also be applied to existing shaped articles, for example by polymerization in situ, lamination, coextrusion, and the like.

Coatings comprising acrylates with a high solids content and a hydroxyl content between 2 and 10 weight percent, which further contain diethylaminoethyl methacrylate, tert-butylaminoethyl methacrylate, 3-(2-methacryloxyethyl)-1,1-spirocyclohexyloxazolidone, and the like for improvement of the adhesion to the surface, are known from published German patent application 30 23 182.

The polymers to be used in accordance with the invention are exceptionally well suited for use as substrates for the anchoring of metal coatings and in this respect are at least on a par with prior art materials. Especially those polymers which primarily or exclusively contain acrylamide as an acrylic acid derivative containing amino groups are superior to the prior art materials because of their greater thermal stability, for example. These copolymers are well adapted to being processed by injection molding and can be exposed without hesitation to the temperatures employed in injection molding, which can be as high as 260° C. and higher.

This higher thermal stability can be demonstrated by thermogravimetric analyses (dynamic vacuum). For example, in copolymers of the invention which primarily or exclusively contain acrylamide as an acrylic acid derivative containing amino groups, the temperature at which a weight loss of 2 percent is observed generally is significantly higher than in polymers incorporating dimethylaminoalkyl methacrylates as comonomers.

The pronounced suitability of copolymers of the invention which primarily or exclusively contain acrylamide as an acrylic acid compound containing amino groups for use as substrates for wet metallization is all the more surprising because the adhesion of wet deposited silver coatings on substrates containing methacrylamide, N-methyl methacrylamide or vinyl methyl acetamide has been found to be decidedly inferior. (cf.Table I.)

A positive factor is that the resin substrates exhibit no signs of etching as a result of the treatment with aromatic acids containing hydroxyl groups and of the subsequent treatment, and that no impairment of the optical quality of the substrates or of the resin layer is observed.

A better understanding of the present invention and of its many advantages will be had from the following Examples, given by way of illustration. Each of the polymers of Examples 1-23 was prepared in the same general fashion described below

GENERAL EXAMPLE FOR PRODUCTION OF THE POLYMER 0.05% of 2,2'-azoisobutyronitrile and, as a polymerization modifier, 0.65% of dodecyl mercaptan are added with stirring to the monomer mixture. The batch is then filtered and the vessel is repeatedly degassed under vacuum for the removal of oxygen. After the mixture has been poured into foil lined polymerization chambers, it is polymerized for about 15 hours at 50° C. in a water bath and then tempered for 30 hours at 45° C. and finally for 8 hours at 100° C. Upon removal from the mold, the material is ground in a hammer mill and then granulated in a vented extruder. The granules can be processed further in the usual manner, for example extruded or compression- or injection-molded, etc. Disks or other test specimens can also be produced directly through bulk polymerization by the method described.

For the purpose of Examples 1-23, specimen disks directly prepared by bulk polymerization are used. For silver coating, these are treated one by one in an 0.1% aqueous tannin solution, the test specimen being dipped for 10 seconds in the tannin solution. Then it is rinsed with water and treated with an aqueous solution containing 0.1 g $SnCl_2$ and 0.1 ml of concentrated HCl per liter. The treating time is 12 seconds. After rinsing, an ammoniacal silver nitrate solution containing 20 g of silver nitrate and 35 ml of ammonia (spec. grav., 0.91), diluted with water to 100 ml, and a reducing solution containing 10 g of sodium gluconate and 2 g of 40% formaldehyde per 100 ml water are atomized onto the specimen, which is again rinsed after metallization.

The grate-cut test in conformity with DIN 53 151 is suitable for testing the adhesion of the silver.

The results of the grate-cut test are presented in Tables I and II which follow. 0 means "no detachment", in other words "excellent adhesion", and 5 means "complete detachment" or "no adhesion".

It is apparent that the claimed polymers of the invention have good adhesion. However, only the particularly preferred ones will pass a climatic test and possess the desired thermal stability. For climatic testing, the specimens are subjected for a total of 8 days to a cycle of 16 hours at 25° C. and 60% relative humidity and 8 hours at 40° C. and 95% relative humidity.

For evaluation of dimensional stability, the Vicat softening temperature (as determined in conformity with DIN 53 460) is also given in Table I. Thermogravimetric analysis is carried out dynamically in a vacuum with a Thermogravimetric Analyzer 950 of Du Pont. (Rate of temperature increase, 5° C./min., 50 Pa., initial weight, 20 mg.).

A key to the abbreviations used in the Tables follows:
MMA=Methyl methacrylate
MA=Methyl acrylate
AA=Acrylamide
MAA=Methacrylamide
MMAA=N-methyl methacrylamide
VMAA=N-vinylmethyl acetamide
DEMA=Dimethylaminoethyl methacrylate The grate-cut test referred to above involves inflicting 5 intersecting cross-cuts in two different portions of the test surface with a standard cutting edge and then brushing lightly back and forth in both directions diagonal to the cuts with a standard brush. The cuts are then examined under magnification, compared with diagrams of standard cuts, and evaluated for adhesion.

PRODUCTION OF A METALLIZED OPTICALLY READABLE INFORMATION-STORAGE DISK

A layer 20 microns thick of an incompletely polymerized varnish which has the composition of the polymer of the invention and is UV-curable is deposited on the surface of a nickel matrix provided with a spiral information track for optical reading. The information track has a crenellated profile of alternately raised and recessed information segments.

The varnish can be deposited by spraying or sprinkling it on. The information segments have very small dimensions, for example differences in height between 0.1 and 0.2 microns and lengths ranging from 0.3 to 3 microns, depending on the type of information stored.

A transparent polymethyl methacrylate disk 1.2 mm thick is laid on the incompletely polymerized varnish layer and this system is exposed for a few seconds through the PMMA disk to the ultraviolet radiation of a 400 watt high pressure mercury vapor lamp (Philips type HPM 12, for example.) After the cure, the PMMA disk along with the cured polymer layer can be removed from the matrix and processed further. The disk is then treated with an 0.3% tannin solution in water, for example by being sprayed with the tannin solution or being dipped into it for 10 seconds.

After rinsing with water, the disk is sensitized with an aqueous $SnCl_2$ solution, for example by being sprayed with or dipped into a solution containing 0.1 g of $SnCl_2$ and 0.1 ml of concentrated HCl per liter of water. The treating time is 12 seconds. The disk is then silver coated by the wet method using an aqueous ammoniacal silver nitrate solution and a reducing solution containing formaldehyde and, optionally, sodium gluconate in water (see above), which are simultaneously atomized onto the surface in the manner described by D. J. Levy in "The Technology of Aerosol Plating", loc. cit. The chemicals used may be purchased in the Federal Republic of Germany from Merck in Darmstadt, for example.

TABLE I

| Example No. | Composition Wt. % | Vicat s. t. °C. | Thermogravimetric analysis T_D* °C. | Thermogravimetric analysis T_A** °C. | Adhesion of silver coating (detachment after grate cut) before climatic testing | Adhesion of silver coating (detachment after grate cut) after climatic testing |
|---|---|---|---|---|---|---|
| 1 | MMA/MA/AA 89:6:5 | 102 | — | — | 0 | 0 |
| @ | MMA/MA/AA 89:8:3 | 105 | 281 | 317 | 0 | 0 |
| 3 | MMA/MA/AA 91:8:1 | 106 | 298 | 324 | 0 | 2–3 |
| 4 | MMA/MA/AA 97:2:1 | 113 | 270 | — | 0 | 5 |
| 5 | MMA/MA/MMAA 93:2:5 | 103 | 183 | — | 0 | 4–5 |
| 6 | MMA/MA/VMAA 89:8:3 | 101 | 207 | 326 | 0 | 5 |
| 7 | MMA/MA/DEMA 89:8:3 | 97 | 197 | 344 | 0 | 0 |
| 8 | MMA/MA 88:12 | 98 | 297 | 319 | 3–4 | 5 |

*$T_D$ = Temperature at which a weight loss of 2% is observed.
*$T_A$ = Temperature at which complete decomposition of the polymer sets in.

TABLE II

| Composition | Adhesion of silver coating (detachment after grate cut) climatic testing before | Adhesion of silver coating (detachment after grate cut) climatic testing after |
|---|---|---|
| Example No. | | |
| 9  MMA/MA/Dimethylaminoethyl methacrylate 91:2:7 | 0 | 0 |
| 10 MMA/MA/Dimethylaminoethyl methacrylate 89:4:7 | 0 | 0 |
| 11 MMA/MA/Dimethylaminoethyl methacrylate 89:6:5 | 0 | 0 |
| 12 MMA/MA/Dimethylaminoethyl methacrylate 89:10:1 | 0 | 1 |
| 13 MMA/MA/Dimethylamino-2,2-dimethylpropyl-1-methacrylate 93:2:5 | 0 | 2 |
| 14 MMA/MA/Dimethylaminopropyl methacrylamide 86:2:12 | 0 | 0 |
| Comparative examples: | | |
| 15 MMA/MA/N-vinylcaprolactam 88:2:10 | 5 | 0 |
| 16 MMA/MA/2-cyanoethyl methacrylate 93:2:5 | 0 | 4 |
| 17 MMA/MA/Acrylonitrile 93:2:5 | 1 | 5 |
| 18 MMA/MA/2-hydroxypropyl methacrylate 93:2:5 | 3 | 5 |
| 19 MMA/MA/Ethyltriglycol methacrylate 93:2:5 | 4 | 5 |
| 20 MMA/MA/Glycidyl methacrylate 88:2:10 | 0 | 5 |
| 21 MMA/MA/Glycidyl methacrylate 83:2:15 | 0 | 3 |
| 22 MMA/MA/3-methacryloxypropyl-trimethoxysilane 93:2:5 | 3 | 4 |
| 23 MMA/MA 88:12 | 2 | 5 |

What is claimed is:

1. A method for metallizing at least a portion of the surface of an article, at least the surface portion of the article to be metallized being a polymer consisting essentially of 50 to 99 percent by weight of an ester of acrylic acid or of methacrylic acid with an alcohol having 1 to 20 carbon atoms, from 0 to 49 percent by weight of at least one member selected from the group consisting of styrene, alpha-methyl styrene, para-methyl styrene, acrylonitrile, or methacrylonitrile, and from 1 to 15 percent by weight of a member selected from the group consisting of acrylamide and dimethyl-aminoethyl methacrylate, which method comprises contacting said surface to be metallized with an hydroxy-substituted aromatic acid and then wet metallizing the acid-treated surface.

2. A method as in claim 1 wherein said acrylamide or dimethylaminoethyl methacrylate is present in an amount of 7±5 percent by weight.

3. A method as in claim 1 wherein said polymer is an acrylic polymer having a glass transition temperature, Tg, above 70° C.

4. A method as in claim 1 wherein said polymer comprises from 50 to 99 percent of methyl methacrylate.

5. A method as in claim 1 wherein said polymer additionally comprises from 1 to 30 percent of methyl acrylate.

6. A method as in claim 1 wherein after said acid treatment and prior to wet metallization, said surface to be metallized is sensitized with a solution of a salt of a reducing metal.

* * * * *